United States Patent [19]
Bleich

[11] Patent Number: 5,357,104
[45] Date of Patent: Oct. 18, 1994

[54] OPTO-LEAF SWITCH FOR PINBALL GAMES HAVING AN INTERRUPTER MEANS MOUNTED ON A LEAF SPRING ACTUATOR ARM

[75] Inventor: Charles R. Bleich, Cary, Ill.

[73] Assignee: Williams Electronics Games, Inc., Chicago, Ill.

[21] Appl. No.: 81,472

[22] Filed: Jun. 23, 1993

[51] Int. Cl.$^5$ .............................................. G01D 5/34
[52] U.S. Cl. ...................... 250/229; 250/221; 200/61.11
[58] Field of Search ............... 250/229, 221; 200/61.1, 200/61.11, 61.19; 273/129 V, 129 R

[56] References Cited

U.S. PATENT DOCUMENTS 2,607,865  8/1952  Gray ................................ 200/61.11
4,152,699  5/1979  Sachsse ............................ 250/229
4,247,211  1/1981  Behrendt et al. ................ 341/31

Primary Examiner—David C. Nelms
Assistant Examiner—Que T. Le
Attorney, Agent, or Firm—Rockey, Rifkin and Ryther

[57] ABSTRACT

The leaf switch of the invention consists of an optical switch mounted on a printed circuit board having electrical conducting means imbedded therein. An opto-interrupter is mounted on an actuator arm that is moved by the player controlled button to close the optical switch and complete the electrical circuit. To complete more than one circuit, a plurality of optical switches are provided with the opto-interrupter mounted on the actuator arm associated with each optical switch. The opto-interrupter is configured such that different ones of the switches are closed depending on how far the player controlled button is depressed.

4 Claims, 1 Drawing Sheet

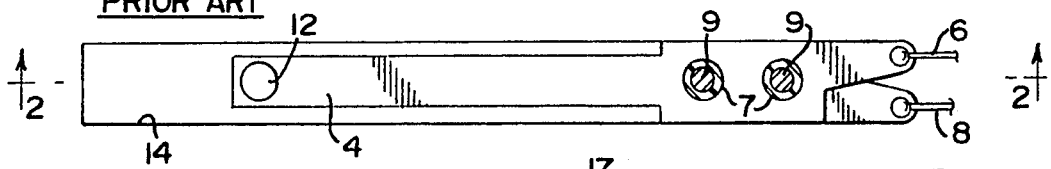
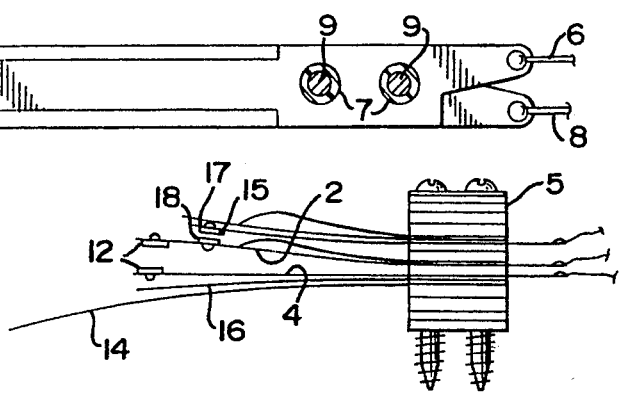
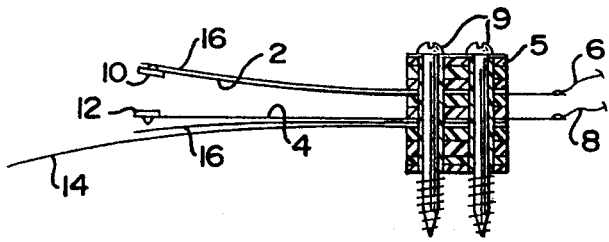
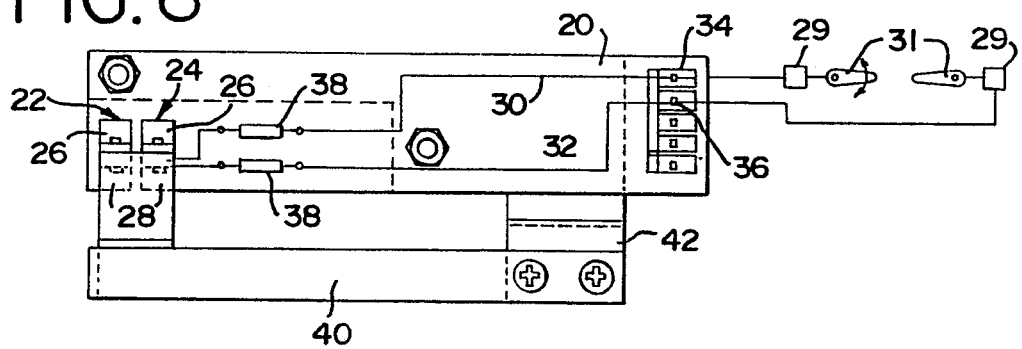
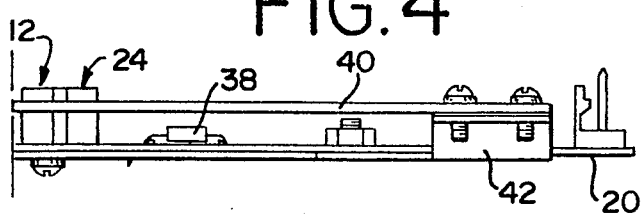
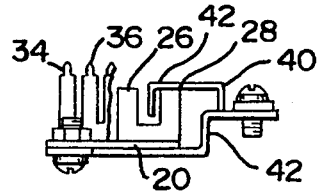
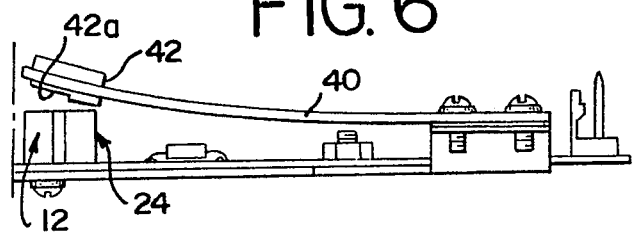
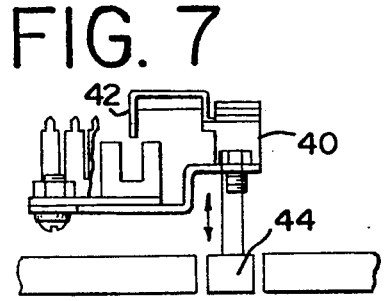

OPTO-LEAF SWITCH FOR PINBALL GAMES HAVING AN INTERRUPTER MEANS MOUNTED ON A LEAF SPRING ACTUATOR ARM

BACKGROUND OF THE INVENTION

This invention relates, generally, to pinball games and, more particularly, to an improved leaf switch for such games.

As shown in FIGS. 1 and 2, a typical leaf switch consists of a pair of flexible electrical leaf contacts 2 and 4 connected to wires 6 and 8, respectively, that lead to a solenoid that activates a flipper or other playfield device or signals the games microprocessor. The electrical leaf contacts 2 and 4 are supported between a number of insulating elements 5 and include contact pads 10 and 12, respectively, that are arranged opposite to one another and are intended to make contact to complete an electrical circuit. Depending on the purpose of the switch the assembly can be secured to the playfield or sidewall of a pinball game cabinet by screws 9 that extend through insulating plastic sleeves 7.

A flexible actuator arm 14 is also supported between insulating pads 5. Actuator arm 14 is typically contacted by a ball or a player manipulated flipper button such that when the button is depressed, actuator arm 14 forces pad 12 into contact with pad 10 to complete an electrical circuit and energize the associated solenoid.

As will be apparent, the prior art switch requires the assembly of numerous mechanical components. As a result, the manufacturing process is cumbersome and time consuming. Moreover, because of the numerous components, it is difficult to properly align the components during installation. Finally, the mechanical contact between the components such as pads 10 and 12 can cause wear and pitting. As a result, reliable electrical contact may deteriorate over time.

FIG. 3 shows the prior art switch used in systems where a single player operated button is used to actuate more than one pair of contracts, as for example to control more than one flipper. This system is similar to that shown in FIGS. 1 and 2 except that an additional electrical contact 15 is provided that completes a circuit when it contacts electrical contact 2. Contacts 15 and 2 are provided with pads 17 and 18, respectively, that complete another electrical circuit. When actuator arm 14 is depressed by the player controlled button, pads 10 and 12 will touch to activate a first flipper and if actuator arm 14 is depressed further, pads 17 and 18 will touch to activate a second flipper. The multi-flipper system of FIG. 3 has the same problems as the system of FIG. 1 compounded by the additional components of the extra electrical contact.

SUMMARY OF THE INVENTION

The leaf switch of the present invention overcomes the above-noted shortcomings and consists of an optical leaf switch mounted to a printed circuit board having electrical components mounted thereon. An opto-interrupter is mounted on a leaf actuator arm that is moved by the player controlled button to close the optical switch and complete an electrical circuit. To actuate more than one flipper, a plurality of optical switches are provided. The opto-interrupter may be arranged such that different switches are closed depending on how far the player controlled button is depressed. The leaf switch of the invention is more reliable, software controlled, and easier to manufacture than the prior art flipper switch, yet maintains the game tactile "feel" to the player as the existing flipper switch.

BRIEF DESCRIPTION OF THE DRAWING

FIG. 1 is a top view of a partially assembled prior leaf switch.

FIG. 2 is a section view of the prior leaf switch.

FIG. 3 is a side view of the prior leaf switch for multiple flippers.

FIG. 4 is a side view of the optical switch of the invention.

FIG. 5 is a front view of the optical switch of the invention.

FIG. 6 is a side view of the optical switch of the invention in the activated position.

FIG. 7 is a front view of the optical switch of the invention in the activated position.

FIG. 8 is a top view of the optical switch of the invention.

DETAILED DESCRIPTION OF THE INVENTION

Referring more particularly to FIGS. 4, 5 and 8 the optical leaf switch of the invention consists of a circuit board 20 on which are mounted optical detectors 22 and 24. Each optical detector includes an emitter 26 and receiver 28. These detectors are commercially available, for example, part number S-1865 manufactured by Senisys. It should be noted that the illustrated embodiment is intended to be used to control two circuits as for example where one optical detector is associated with each of two flipper circuits. Each flipper circuit consists of a flipper 31 and actuator 29 such as a solenoid. If only one flipper is to be controlled, one of the optical detectors can be omitted or used as a backup for enhanced reliability. If more than two flippers are to be controlled, additional switches can be added.

The circuit board 20 further includes electrically conductive traces 30 and 32 imbedded therein for connecting the detectors to connector pins 34 and 36. Pins 34 and 36 are wire connectors for completing the circuits to be controlled by the optical leaf switches of the invention. A resistor 38 is located in each circuit to provide the current required by the emitters 26.

A leaf actuator arm 40 is mounted to flange 42 that is fixed to circuit board 20. Extending from actuator arm 40 is an opto-interrupter element 42. As best shown in FIGS. 4 and 5, actuator arm 40 is biased such that opto-interrupter 42 is normally disposed between emitters 26 and receivers 28 and the optical detectors are interrupted causing an open circuit. In the preferred embodiment, the bias is provided by making the actuator arm 40 flexible, although a rigid arm with a separate biasing means such as a spring could be used. A player controlled button 44 or a pinball, in the case of a playfield mounted opto-leaf switch, moves actuator arm 40 to displace the opto-interrupter 42 out of the path of the optical detectors thereby completing the circuits.

As best shown in FIG. 6, the illustrated opto-interrupter 42 has a stepped profile 42a such that if actuator arm 40 is moved a first distance only one detector will close a circuit and, for example, one of flippers 31 will be actuated. When the actuator arm 40 is moved further, both circuits will be closed and both flippers 31 will be activated. The opto-interrupter 42 could have different shapes such that the circuits are activated in reverse order or both circuits are activated simultaneously. Where more than two circuits are to be controlled, additional combinations of optical detectors and interrupters are used.

The optical leaf switch of the invention eliminates the mechanical contacts of the prior art devices resulting in a more durable and reliable switch. Moreover, the optical switch involves fewer components and is, therefore, much simpler and inexpensive to manufacture and install. The use of the optical detectors also gives greater flexibility as to the number of flippers that can be activated and their sequence of operation. Finally, the design of the invention maintains the game tactile performance or "feel" for the player as the existing switches, a significant benefit in view of game player's sensitivity to the "feel" of the game.

While the invention has been described in some detail with respect to the drawings, it will be appreciated that numerous changes in the construction and details of the device can be made without departing from the spirit and scope of the invention.

What is claimed is:

1. An optical leaf switch assembly for a pinball game comprising:
   a) a first optical detector consisting of a light emitter and a light receiver for detecting the light from said emitter and for completing a circuit in response thereto;
   b) at least one flipper located in said circuit, said flipper being actuated when said circuit is completed;
   c) interrupter means movable between a first, blocking position in which light is prevented from reaching the receiver and a second position in which light from the emitter is allowed to reach the receiver, said interrupter means being mounted on a leaf spring actuator arm that is normally biased to said first position; and
   d) a player operated button operatively connected to said actuator arm for moving said interrupter means to the second position.

2. The optical leaf switch assembly according to claim 1, further comprising a second optical detector consisting of a light emitter and light detector, said interrupter means configured to operate said second optical detector intermediate said first and second position.

3. An optical leaf switch assembly, comprising:
   a) a first optical detector consisting of a light emitter and a light receiver for detecting the light from said emitter and for completing a circuit in response thereto, said detector and emitter being mounted on a printed circuit board; and
   b) interrupter means movable between a first blocking position where light from the emitter is prevented from reaching the receiver and a second position in which light from the emitter is allowed to reach the receiver, said interrupter means being mounted on a leaf spring actuator arm that is normally biased to said first position, said actuator arm also being mounted on said circuit board.

4. The optical leaf switch according to claim 3, further comprising a second optical detector consisting of a light emitter and light detector, said interrupter means configured to operate said second optical detector intermediate said first and second position.

* * * * *